United States Patent
De Oliveira et al.

(10) Patent No.: US 11,609,292 B2
(45) Date of Patent: Mar. 21, 2023

(54) DEVICE AND METHOD FOR NUCLEAR MAGNET RESONANCE SPECTROSCOPY

(71) Applicant: Siemens Healthcare GmbH, Erlangen (DE)

(72) Inventors: Andre De Oliveira, Uttenreuth (DE); Andreas Greiser, Erlangen (DE); Peter Speier, Erlangen (DE); Adrian Mark Thomas, Bicester (GB)

(73) Assignee: SIEMENS HEALTHCARE GMBH, Erlangen (DE)

( * ) Notice: Subject to any disclaimer, the term of this patent is extended or adjusted under 35 U.S.C. 154(b) by 0 days.

(21) Appl. No.: 17/224,320

(22) Filed: Apr. 7, 2021

(65) Prior Publication Data
US 2021/0318402 A1    Oct. 14, 2021

(30) Foreign Application Priority Data

Apr. 14, 2020 (EP) .................... 20169364

(51) Int. Cl.
*G01R 33/46* (2006.01)
*G01R 33/28* (2006.01)

(52) U.S. Cl.
CPC ....... *G01R 33/4633* (2013.01); *G01R 33/282* (2013.01)

(58) Field of Classification Search
CPC .............. G01R 33/4633; G01R 33/282; G01R 33/34007; G01R 33/3802; G01R 33/381; G01R 33/3815; G01R 33/4814; G01R 33/383; G01R 33/445; G01R 33/46; G01R 33/3808
See application file for complete search history.

(56) References Cited

U.S. PATENT DOCUMENTS

| | | |
|---|---|---|
| 6,828,892 B1 | 12/2004 | Fukushima et al. |
| 2006/0055404 A1 | 3/2006 | Volke et al. |
| 2011/0160566 A1 | 6/2011 | Petropoulos et al. |
| 2012/0223705 A1 | 9/2012 | Lowery et al. |
| 2015/0051475 A1 | 2/2015 | Leussler et al. |

(Continued)

FOREIGN PATENT DOCUMENTS

WO   WO 2009085214 A1   7/2009

OTHER PUBLICATIONS

Blümich B. et. al., "Degradation of historical paper: nondestructive analysis by the NMR-MOUSE", Journal of Magnetic Resonance, vol. 161, pp. 204-209, 2003.

(Continued)

*Primary Examiner* — Susan S Lee
(74) *Attorney, Agent, or Firm* — Harness, Dickey & Pierce, P.L.C.

(57) ABSTRACT

A device for NMR spectroscopy includes a magnet arrangement, configured to produce a magnetic probe field within a magnet field of view external to the magnet arrangement. In a embodiment, the device includes a coil arrangement, configured to generate an electromagnetic excitation field within a coil field of view and a controller, configured to control the coil arrangement. The device includes a magnet adjustment arrangement, configured and arranged to modify at least one parameter of the magnet arrangement to change a spatial position of the magnet field of view.

22 Claims, 5 Drawing Sheets

(56) References Cited

U.S. PATENT DOCUMENTS

2019/0033405 A1* 1/2019 Fath .................. G01R 33/3875
2020/0069293 A1 3/2020 Julian et al.

OTHER PUBLICATIONS

Blümich B. et. al., "The NMR-MOUSE: Construction, Excitation, and Applications", Magnetic Resonance Imaging, vol. 16, pp. 479-484, 1998.
European Search Report for European Application No. 20169364.5 dated Feb. 10, 2021.
European Search Report for European Application No. 20169364.5 dated Oct. 20, 2020.
Speier, Peter, "Low Cost MR Monitoring of Thalassemia," 2006.

* cited by examiner

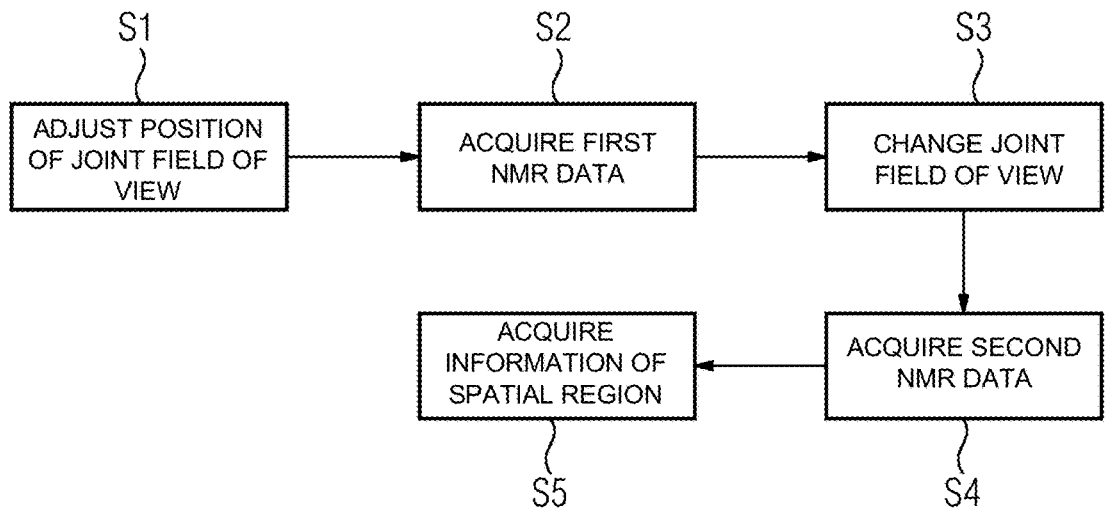
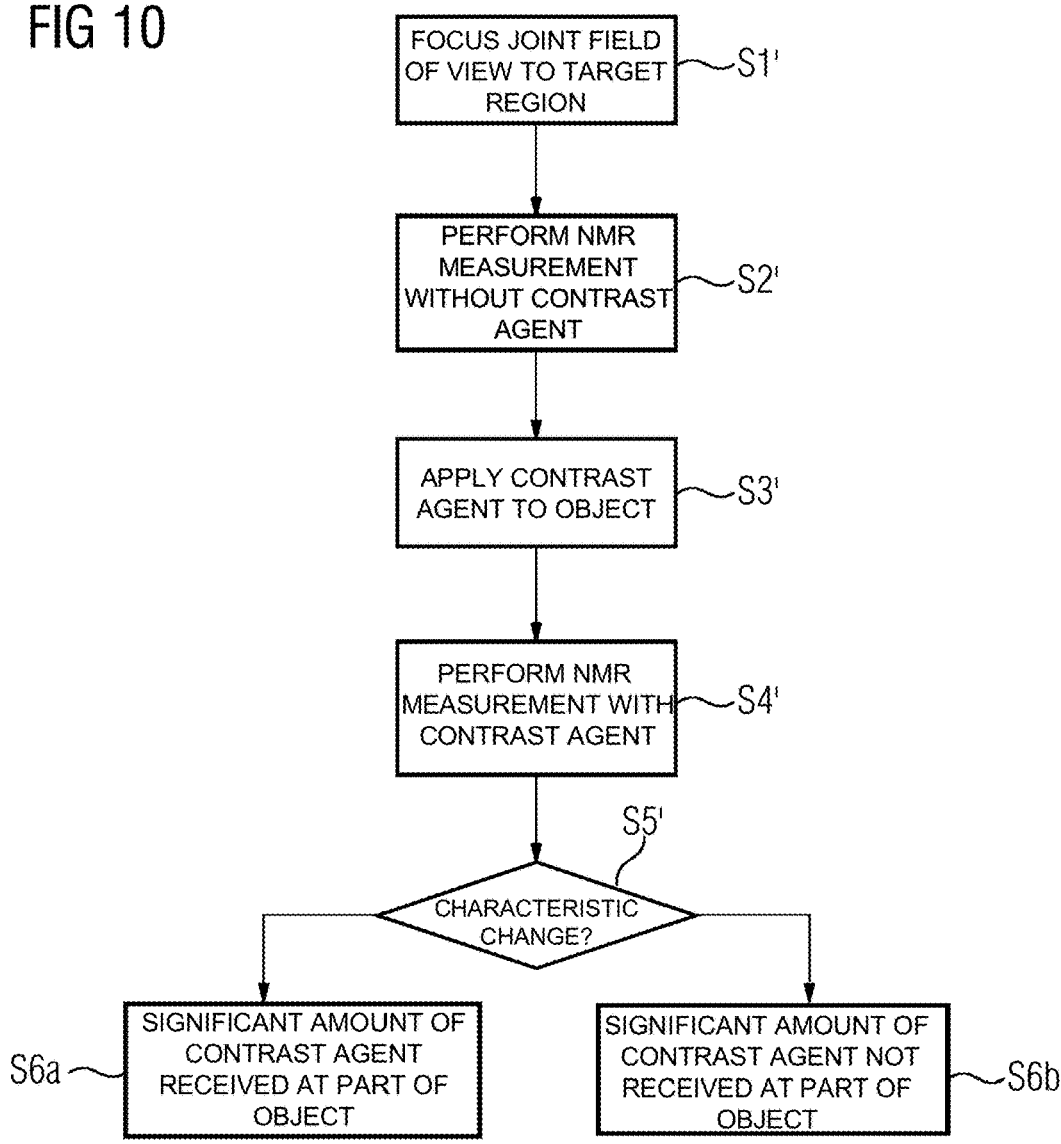

DEVICE AND METHOD FOR NUCLEAR MAGNET RESONANCE SPECTROSCOPY

PRIORITY STATEMENT

The present application hereby claims priority under 35 U.S.C. § 119 to European patent application number EP 20169364.5 filed Apr. 14, 2020, the entire contents of which are hereby incorporated herein by reference.

FIELD

Example embodiments of the invention generally relate to a device for nuclear magnetic resonance spectroscopy comprising a magnet arrangement, configured to produce a magnetic probe field within a magnetic field of view external to the magnet arrangement and a coil arrangement, configured to generate an electromagnetic excitation field within a coil field of view and a control unit, configured to control the coil arrangement. Example embodiments of the invention further generally relate to a corresponding method for nuclear magnetic resonance spectroscopy.

BACKGROUND

Magnetic resonance imaging, MRI, applies the effect of nuclear magnetic resonance, NMR, to create material specific images of objects. To this end, a magnetic probe field is generated and nuclear spins of the object material are excited by radio frequency pulses according to defined sequences. By evaluating the electromagnetic signals caused by subsequent resonances of the precessing nuclear spins, characteristic material specific parameters may be obtained.

However, for MRI, the object is located within a bore of the magnet arrangement and the magnet arrangement is required to produce a very strong and extremely homogenous magnetic field in a comparably large spatial area. Consequently, devices for MRI are usually very expensive.

Document U.S. Pat. No. 6,828,892 B1 describes a unilateral magnet for NMR applications, which is able to produce a substantially uniform magnetic field in a region external to a body of a magnetic field generating apparatus.

SUMMARY

At least one embodiment of the present invention provides an improved concept for nuclear magnetic resonance spectroscopy, which imposes less stringent requirements on a magnet arrangement of the device, in particular compared to an MRI apparatus.

This problem is improved upon or even solved by the respective subject matter of at leasty one embodiment. Further implementations and preferred embodiments are subject matter of the claims.

The improved concept is based on the idea to provide a magnet arrangement for producing a magnetic probe field, wherein at least one parameter of the magnet arrangement can be modified to change a spatial position of the respective magnet field of view.

According to example embodiments of the improved concept, a device for nuclear magnetic resonance, NMR, spectroscopy is provided.

In an embodiment, the device comprises a magnet arrangement, which is configured to produce a magnetic probe field with a magnet field of view of the magnet arrangement, wherein the magnet field of view is at least in part external to the magnet arrangement. The device comprises a coil arrangement, which is configured to generate an electromagnetic excitation field within a coil field of view of the coil arrangement. The device comprises a control unit, configured to control the coil arrangement, and, in particular configured to control the magnet arrangement. The device comprises a magnet adjustment arrangement. The magnet adjustment arrangement is configured and arranged to modify at least one parameter of the magnet arrangement to change a spatial position of the magnet field of view.

According to the improved concept, also a method for nuclear magnetic resonance spectroscopy, NMR spectroscopy, is provided in at least one embodiment. According to several implementations, of the method, a device for NMR spectroscopy according to the improved concept is used for the NMR spectroscopy. According to several implementations of the method, a magnet field of view of a magnet arrangement of a device for NMR spectroscopy, in particular according to the improved concept, wherein the magnet field of view is external to the magnet arrangement, and/or a coil field of view of a coil arrangement of the device are adjusted to achieve a first joint field of view given by an overlapping volume of the magnet field of view and the coil field of view, in particular after the adjustment. First magnetic resonance data regarding an object is acquired according to the first joint field of view.

According to the improved concept, also a further method for NMR spectroscopy, in particular using a device according to the improved concept, is provided in at least one embodiment. According to the further method, first magnetic resonance data regarding an object is acquired according to a first joint field of view, wherein the first joint field of view is given by an overlapping volume of a magnet field of view of a magnet arrangement of a device for NMR spectroscopy, and a coil field of view of a coil arrangement of the device. After acquiring the first magnetic resonance data, a contrast agent is applied, in particular is injected, to the object. After applying the contrast agent, the third magnetic resonance data regarding the object is acquired according to the first joint field of view. It is determined, in particular by a control unit of the device, based on a comparison of the first magnetic resonance data to the third magnetic resonance data, to what extent a part of the object within the first joint field of view has received the contrast agent.

Further implementations of the methods according to the improved concept follow directly from the various implementations of the device according to the improved concept and vice versa. In particular, a device according to the improved concept, in at least one embodiment, may be configured to or programmed to carry out a method according to the improved concept or the device carries out such a method.

According to the improved concept, also a computer program comprising instructions is provided in at least one embodiment. If the instructions or the computer program are executed by a device according to the improved concept, in particular by the control unit of the device, the instructions cause the device to carry out a method for NMR spectroscopy according to the improved concept.

According to the improved concept, also a computer readable storage medium storing a computer program according to the improved concept is provided in at least one embodiment.

According to the improved concept, an embodiment is directed to a device for nuclear magnetic resonance spectroscopy, comprising:

a magnet arrangement, configured to produce a magnetic probe field within a magnet field of view external to the magnet arrangement;

a coil arrangement, configured to generate an electromagnetic excitation field within a coil field of view;

a controller, configured to control the coil arrangement; and a magnet adjustment arrangement, configured and arranged to modify at least one parameter of the magnet arrangement to change a spatial position of the magnet field of view.

According to the improved concept, an embodiment is directed to a method for nuclear magnetic resonance spectroscopy, comprising:

adjusting at least one of a magnet field of view of a magnet arrangement of a device for nuclear magnetic resonance spectroscopy, the magnet field of view being external to the magnet arrangement, and a coil field of view of a coil arrangement of the device, the adjusting achieving a first joint field of view given by an overlapping volume of the magnet field of view and the coil field of view; and acquiring first magnetic resonance data regarding an object, according to the first joint field of view.

BRIEF DESCRIPTION OF THE DRAWINGS

Further features of the invention are apparent from the claims, the figures and the description of figures. The features and feature combinations mentioned above in the description as well as the features and feature combinations mentioned below in the description of figures and/or shown in the figures alone may not only be encompassed by the improved concept in the respectively specified combination, but also in other combinations. Thus, implementations of the improved concept are encompassed and disclosed, which may not explicitly be shown in the figures or explained, but arise from and can be generated by separated feature combinations from the explained implementations. Implementations and feature combinations, which do not have all features of an originally formulated claim, may be encompassed by the improved concept. Moreover, implementations and feature combinations, which extend beyond or deviate from the feature combinations set out in the relations of the claims, may be encompassed by the improved concept.

In the figures:

FIG. 9 a flow diagram of an example implementation of a method according to an embodiment of the improved concept; and FIG. 10 a flow diagram of a further example implementation of a method according to an embodiment of the improved concept.

DETAILED DESCRIPTION OF THE EXAMPLE EMBODIMENTS

Figure 1:
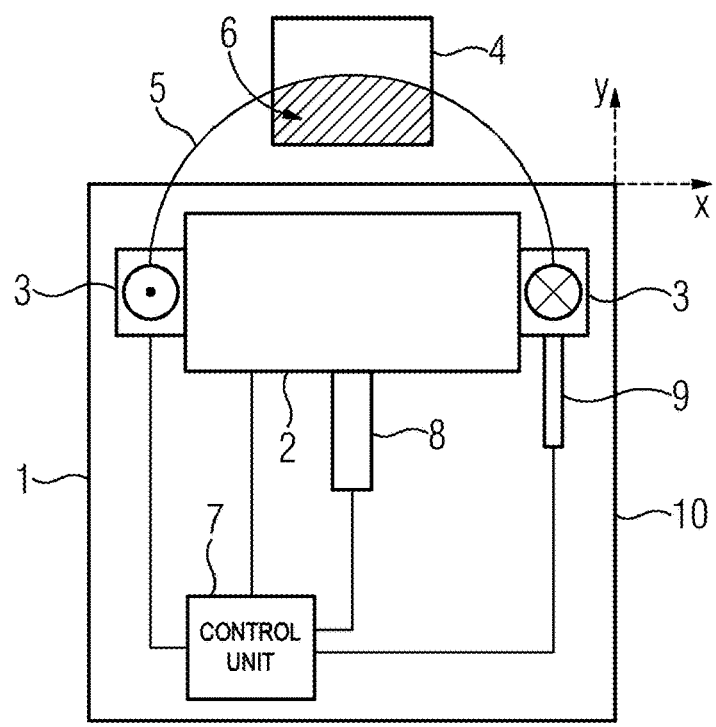
FIG. 1 shows schematically an example implementation of a device according to an embodiment of the improved concept.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. At least one embodiment of the present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without subdividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Bluray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (procesor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

In an embodiment, the device comprises a magnet arrangement, which is configured to produce a magnetic probe field with a magnet field of view of the magnet arrangement, wherein the magnet field of view is at least in part external to the magnet arrangement. The device comprises a coil arrangement, which is configured to generate an electromagnetic excitation field within a coil field of view of the coil arrangement. The device comprises a control unit, configured to control the coil arrangement, and, in particular configured to control the magnet arrangement. The device comprises a magnet adjustment arrangement. The magnet adjustment arrangement is configured and arranged to modify at least one parameter of the magnet arrangement to change a spatial position of the magnet field of view.

The magnet arrangement can be understood as an arrangement configured to generate a magnetic field, in particular the magnetic probe field. To this end, the magnet arrangement may comprise one or more magnet components, which may also be denoted as magnet field generating units, such as permanent magnets, superconductor based magnets and/or electromagnets.

The magnet arrangement may produce a magnetic field also outside the magnetic field of view. However, inside the magnet field of view, the magnetic probe field fulfils predefined required or desired properties. These properties may include a strength of the magnetic field, an intensity of the magnetic field, a maximum gradient of the magnetic field and/or a homogeneity of the magnetic field. However, it is pointed out that the magnet probe field is not necessarily homogenous within the magnet field of view, as it is usually the case for MRI apparatuses.

The magnetic arrangement being configured to produce the magnetic probe field may for example be understood such that all magnet components of the magnet arrangement together may produce the magnetic probe field.

In other words, the magnet field of view may be considered as a spatial region, in particular three-dimensional spatial region, wherein said properties of the magnetic probe field are fulfilled. In particular, the magnet field of view overlaps at least in part with the coil field of view such that the excitation field is generated at least in part within the magnet field of view. In other words, an NMR signal of nuclear spins located within a joint field of view, which is given by an overlap region of the magnet field of view and the coil field of view, may be detected by the coil arrangement.

Therefore, by changing the spatial position of the magnet field of view, in general also the spatial position of the joint field of view may be changed.

The coil arrangement may be understood to contain one or more coils, in particular one or more transmission coils or TX coils for generating the electromagnetic excitation field. The coil arrangement can also comprise one or more receiver coils or antenna coils or RX coils configured to detect the NMR resonance signal.

The at least one parameter of the magnet arrangement may comprise any parameter, whose modification may change the spatial position of the magnet field of view. This may for example comprise parameters related to the position or orientation of a magnet component or parameters affecting the strength of the individual contributions of the magnet components to the magnetic probe field.

The change of the spatial position of the magnet field of view may for example be understood as a change relative to the device or to a predefined reference frame, which is rigidly connected to the device, for example to a frame component or housing component of the device or of the magnet arrangement. In other words, the overall position of the device may for example remain constant when the spatial position of the magnet field of view is changed.

Controlling the coil arrangement by the control unit may for example comprise controlling the generation of the excitation field, the generation of corresponding excitation pulses, the timing of these pulses and so forth. Controlling the coil arrangement may also include receiving or detecting NMR signals in response to the excitation field and the magnetic probe field and transmitting them to the control unit.

The control unit may also control the magnet arrangement. For example, controlling the magnet arrangement may comprise turning on or off the magnetic probe field or changing the strength of the magnetic probe field, provided any of this is possible according to the concrete design of the magnet arrangement.

By changing the spatial position of the magnet field of view and correspondingly the spatial position of the joint field of view by means of a device according to the improved concept, an increased flexibility for spectroscopic NMR analysis of an object, for example a person, is achieved.

In particular, requirements regarding the size of the joint field of view can be relaxed, since a smaller joint field of view can be used and a region can be scanned by modifying the spatial position of the magnet field of view and the joint field of view.

This, in turn, leads to relaxed requirements for the magnet arrangement or the magnet components, in particular regarding homogeneity of the probe magnetic field and strength of the probe magnetic field.

It has been found that the strength of the magnetic probe field, in particular its maximum strength, may be kept smaller than 1.5 T and may even be as small as 0.1 T.

It has also been shown that a joint field of view of approximately 1 cm3 or a similar size order may be sufficient. To this end, it may be sufficient to achieve a magnet field of view in the order of 5 cm×5 cm×5 cm or, preferably, 10 cm×10 cm×10 cm, for example at a resolution of 100 ppm.

In consequence, the device may for example be designed as a portable or movable device and the overall device costs may be reduced due to the lower requirements to the magnet.

Furthermore, compared to MRI apparatuses, the device according to the improved concept does not necessarily require any gradient coils to systematically scan a k-space for imaging.

According to several implementations of the device, the coil field of view is located at least in part external to the magnet arrangement and/or to the coil arrangement and/or to the device.

According to several implementations, the joint field of view is located at least in part external to the magnet arrangement and the device and/or the coil arrangement.

According to several implementations, the coil arrangement is configured to detect an NMR signal in response to an excitation of a spin ensemble within the joint field of view, in particular caused by the electromagnetic excitation field.

According to several implementations, the control unit is configured to control the coil arrangement and/or the magnet arrangement to carry out an NMR spectroscopy sequence.

According to several implementations, the control unit is configured to control the magnet adjustment arrangement to modify the at least one parameter.

According to several implementations, the magnet arrangement comprises one or more magnet components. The magnet adjustment arrangement is configured to modify a spatial position and/or a spatial orientation of at least one of the one or more magnet components to change the spatial position of the magnet field of view.

In other words, the at least one parameter of the magnet arrangement comprises the position and/or orientation of the respective magnet component.

In particular, the modification of the position and/or orientation of the magnet component is independent of a position and or orientation of the coil arrangement or individual coils.

In other words, the magnet component can be moved independently from a movement of the coil arrangement.

Since the pose of the magnet components, in particular the position and/or orientation of the magnet components, translates directly to the position of the magnet field of view, such implementations impose particularly low requirements to the magnet adjustment arrangement. In particular, the magnet adjustment arrangement may essentially comprise a mechanical arrangement to move, translate or rotate one or more of the magnet components.

In particular, the modification of the position and/or orientation of the one or more magnet components corresponds to a modification of the position and/or orientation with respect to the predefined reference frame.

In particular, the respective magnet component may be moved without changing the position or orientation of the whole device.

According to several implementations, the magnet arrangement comprises, in particular the one or more magnet components comprise, an electromagnet. The magnet adjustment arrangement is configured to modify a current through the electromagnet to change the spatial position of the magnet field of view.

In other words, the at least one parameter of the magnet arrangement comprises the current.

The current through the electromagnetic corresponds, in particular, to a value of a current flowing through a wire or a coil of the electromagnet.

In particular, such implementations may be beneficial in case the magnet arrangement comprises the electromagnet and at least one further magnet component. Changing the current trough the electromagnet, and consequently the contribution of the electromagnet to the magnetic probe field, the position of the magnet field of view may be shifted.

In such implementations, a more detailed adjustment of the spatial position of the magnet field of view and consequently the joint field of view may be possible. In other words, the position of the joint field of view may be changed with a higher resolution.

According to several implementations, the magnet arrangement, in particular the one or more magnet components, comprises at least two magnet components and the magnet adjustment arrangement is configured to modify a relative position and/or a relative orientation of the at least two magnet components with respect to each other to change the spatial position of the magnet field of view.

In other words, the at least one parameter of the magnet arrangement comprises the relative position and/or the relative orientation of the at least two magnet components with respect to each other. In such implementations, also a more detailed adjustment of the magnet field of view or the joint field of view is achievable.

According to several implementations, the device comprises a coil adjustment arrangement, which is configured and arranged to modify at least one parameter of the coil arrangement to change a spatial position of the coil field of view.

By changing the position of the coil field of view, also the position of the joint field of view may be changed.

In particular, such implementations allow to change the position of the magnet field of view and the position of the coil field of view independent of each other but, in particular, at the same time, which allows for a higher flexibility.

According to several implementations, the control unit is configured to control the adjustment arrangement to modify the at least one parameter of the coil arrangement.

According to several implementations, the coil arrangement comprises one or more coils, in particular transmitter coils and/or receiver coils, and/or antennas. The coil adjustment arrangement is configured to modify a spatial position and/or a spatial orientation and/or a geometric shape of at least one of the one or more coils to change the spatial position of the coil field of view.

The geometric shape of the respective coil may for example correspond to a diameter of the coil, a shape of a contour or of cross section of the coil.

The geometric shape may also comprise an orientation of a part of the coil or a part of the windings of the coil.

According to several implementations, the device comprises an ultrasonic sensor system with an ultrasonic field of view.

The ultrasonic sensor system, which may for example be designed as an active ultrasonic sensor system, may comprise an ultrasonic probe or an ultrasonic transducer. The ultrasonic sensor system may also comprise an emitter for ultrasonic waves in the receiver.

In such implementations, the device may be used for ultrasonic guided NMR spectroscopy or NMR guided ultrasonic investigations of tissue or other materials. In particular, the ultrasonic sensor system may be used to acquire spatial or positional information or anatomical information and the NMR spectroscopy may be used to acquire material or tissue specific or physiological parameters of the object.

In particular, the device allows to measure the ultrasonic information and the NMR based information at the same time.

By supporting the ultrasonic procedure with the NMR or by guiding the NMR spectroscopy with the ultrasonic sensor system, an increased specificity may be achieved.

According to several implementations, the ultrasonic sensor system is mechanically coupled to the magnet arrangement to ensure a fixed spatial relation between the ultrasonic field of view and the magnet field of view.

By way of the mechanical coupling of the ultrasonic sensor system to the magnet arrangement, the ultrasonic field of view and the magnet field of view or, in other words, the ultrasonic field of view and the joint field of view may be considered as intrinsically registered without the need for a software-based subsequent registration of corresponding data.

In particular, the mechanical coupling may for example be designed such that the ultrasonic field of view follows any movement of the magnet field of view or the joint field of view or vice versa.

According to several implementations, the ultrasonic sensor system is rigidly fixed to the magnet arrangement or to one of the magnet components.

For example, the magnet component may have a respective housing and the ultrasonic sensor system may be fixed to the housing of the magnet arrangement.

According to several implementations, the device comprises a monitoring system, which is configured to determine a spatial relation between the ultrasonic sensor system and the magnet arrangement or, in other words, between the ultrasonic field of view and the magnet field of view.

In particular, determining the spatial relation between the ultrasonic sensor system and the magnet arrangement continuously or repeatedly may be considered as monitoring the corresponding spatial relation.

In such implementations, the spatial relation of the ultrasonic field of view and the magnet field of view may not necessarily be fixed per se, but the spatial relation may be known due to the monitoring system.

According to several implementations, the device comprises an ultrasonic adjustment arrangement, which is configured and arranged to adjust the spatial relation between the ultrasonic sensor system and the magnet arrangement, in particular depending on the determined spatial relation, to ensure a fixed spatial relation between the ultrasonic field of view and the magnet field of view.

Also in this way, an intrinsic coupling or intrinsic registration of the ultrasonic field of view and the magnet field of view may be achieved.

According to several implementations, the control unit is configured to control the ultrasonic sensor system and the coil arrangement to carry out an ultrasonic assisted magnetic resonance spectroscopy.

According to several implementations, the control unit is configured to control the coil arrangement, and in particular the magnet arrangement, according to a free induction decay, FID, sequence or according to a spin-echo FID sequence.

In such implementations, the device does not need gradient coils for generating magnetic field gradients in order to scan the corresponding k-space. Rather, the FID sequence or spin-echo FID sequence may provide a simple but powerful tool to extract several types of information including proton density, fat content, water content, T2-time and/or T2*time.

According to the improved concept, also a method for nuclear magnetic resonance spectroscopy, NMR spectroscopy, is provided.

According to several implementations, of the method, a device for NMR spectroscopy according to the improved concept is used for the NMR spectroscopy.

According to several implementations of the method, a magnet field of view of a magnet arrangement of a device for NMR spectroscopy, in particular according to the improved concept, wherein the magnet field of view is external to the magnet arrangement, and/or a coil field of view of a coil arrangement of the device are adjusted to achieve a first joint field of view given by an overlapping volume of the magnet field of view and the coil field of view, in particular after the adjustment. First magnetic resonance data regarding an object is acquired according to the first joint field of view.

The object is, in particular, positioned at least in part within the first joint field of view.

In particular, the first joint field of view is located external to the magnet arrangement and/or the coil arrangement and/or the device.

According to several implementations, the magnet field of view and/or the coil field of view are changed to achieve a second joint field of view given by the overlapping volume of the magnet field of view and the coil field of view, in particular after the change of the magnet field of view and the coil field of view. Second magnetic resonance data regarding the object is acquired according to the second joint field of view.

In particular, the object is positioned at least in part within the second joint field of view.

In particular, the second joint field of view is located external to the magnet and/or the coil arrangement and/or the device.

In particular, by changing the magnet field of view and the coil field of view, the first joint field of view is changed to result in the second joint field of view.

According to several implementations, the first magnetic resonance data and the second magnetic resonance data are interpolated to determine virtual magnetic resonance data for a spatial region between the first joint field of view and the second joint field of view.

By the interpolation, information about regions may be acquired, which are even smaller than the first and the second joint field of view. In other words, the spatial resolution of the device or the method is effectively increased.

According to several implementations of the method, a contrast agent is applied, in particular is injected, to the object after acquiring the first magnetic resonance data. After applying the contrast agent, third magnetic resonance data regarding the object is acquired according to the first joint field of view. It is determined, in particular by the control unit, based on a comparison of the first magnetic resonance data and the third magnetic resonance data, in particular based on a result of the comparison, to what extent a part of the object within the first joint field of view has received the contrast agent.

In particular, no contrast agent or only a different contrast agent is applied to the object before acquiring the first magnetic resonance data.

Such implementations have the advantage that detailed information about the material or tissue may be obtained without performing a tomography as for MRI.

According to several implementations, the coil arrangement is controlled according to a free induction decay, FID, sequence or according to a spin echo FID sequence for acquiring the first magnetic resonance data, and in particular also for acquiring the second magnetic resonance data and/or the third magnetic resonance data.

According to several implementations an ultrasonic assisted magnetic resonance spectroscopy is carried out by controlling the coil arrangement and an ultrasonic sensor system of the device. The ultrasonic sensor system has an ultrasonic field of view and is mechanically coupled to the magnet arrangement to ensure a fixed spatial relation between the ultrasonic field of view and the magnet field of view.

Due to the mechanical coupling, the ultrasonic field of view and the magnet field of view can be considered to be intrinsically registered.

According to the improved concept, also a further method for NMR spectroscopy, in particular using a device according to the improved concept, is provided. According to the further method, first magnetic resonance data regarding an object is acquired according to a first joint field of view, wherein the first joint field of view is given by an overlapping volume of a magnet field of view of a magnet arrangement of a device for NMR spectroscopy, and a coil field of view of a coil arrangement of the device. After acquiring the first magnetic resonance data, a contrast agent is applied, in particular is injected, to the object. After applying the contrast agent, the third magnetic resonance data regarding the object is acquired according to the first joint field of view. It is determined, in particular by a control unit of the device, based on a comparison of the first magnetic resonance data to the third magnetic resonance data, to what extent a part of the object within the first joint field of view has received the contrast agent.

Further implementations of the methods according to the improved concept follow directly from the various implementations of the device according to the improved concept and vice versa. In particular, a device according to the improved concept, in at least one embodiment, may be configured to or programmed to carry out a method according to the improved concept or the device carries out such a method.

According to the improved concept, also a computer program comprising instructions is provided in at least one embodiment. If the instructions or the computer program are executed by a device according to the improved concept, in particular by the control unit of the device, the instructions cause the device to carry out a method for NMR spectroscopy according to the improved concept.

According to the improved concept, also a computer readable storage medium storing a computer program according to the improved concept is provided in at least one embodiment.

In FIG. 1, an example implementation of a device 1 of an embodiment for NMR spectroscopy according to the improved concept is shown.

The device 1 comprises a magnet arrangement 2, which is configured to produce a magnetic probe field within a magnet field of view 4, located external to the device 1.

The device 1 further comprises a coil arrangement 3, configured to generate an electromagnetic excitation field within a coil field of view 5, which extends at least in part to the outside of the device 1. The coil field of view 5 and the magnet field of view 4 overlap at least in part and the overlapping volume defines a joint field of view 6.

The device 1 further comprises a magnet adjustment arrangement 8, which is coupled to the magnet arrangement 2 and configured to modify one or more parameters of the magnet arrangement 2 in order to shift the spatial position of the magnet field of view 4.

The device 1 may optionally comprise a housing 10, wherein the magnet arrangement 2 and the coil arrangement 3 are arranged inside the housing 10 and the joint field of view 6 is located outside of the housing 10. The change of the position of the magnet field of view 4 may for example be understood as a change relative to a coordinate system x-y, rigidly fixed to the housing 10.

Optionally, the device 1 comprises a coil adjustment arrangement 9 coupled to the coil arrangement 3 and configured to modify at least one parameter of the coil arrangement 3 to change a spatial position of the coil field of view 5.

By changing the spatial position of the magnet field of view 4 and/or the coil field of view 5, the spatial position of the joint field of view 6 may be varied.

The device 1 further comprises a control unit 7 coupled to the coil arrangement 3 and optionally coupled to the magnet arrangement 2. The control unit 7 is configured to control the coil arrangement 3 to generate the excitation field, for example to generate one or more excitation pulses according to a predefined sequence for NMR spectroscopy, for example a FID sequence or a spin-echo FID sequence.

The control unit 7 may also be coupled to the magnet adjustment arrangement 8 and/or the coil adjustment arrangement 9 to control them, respectively, in order to change the position of the magnet field of view 4 and/or the coil field of view 5, respectively.

Figure 2:
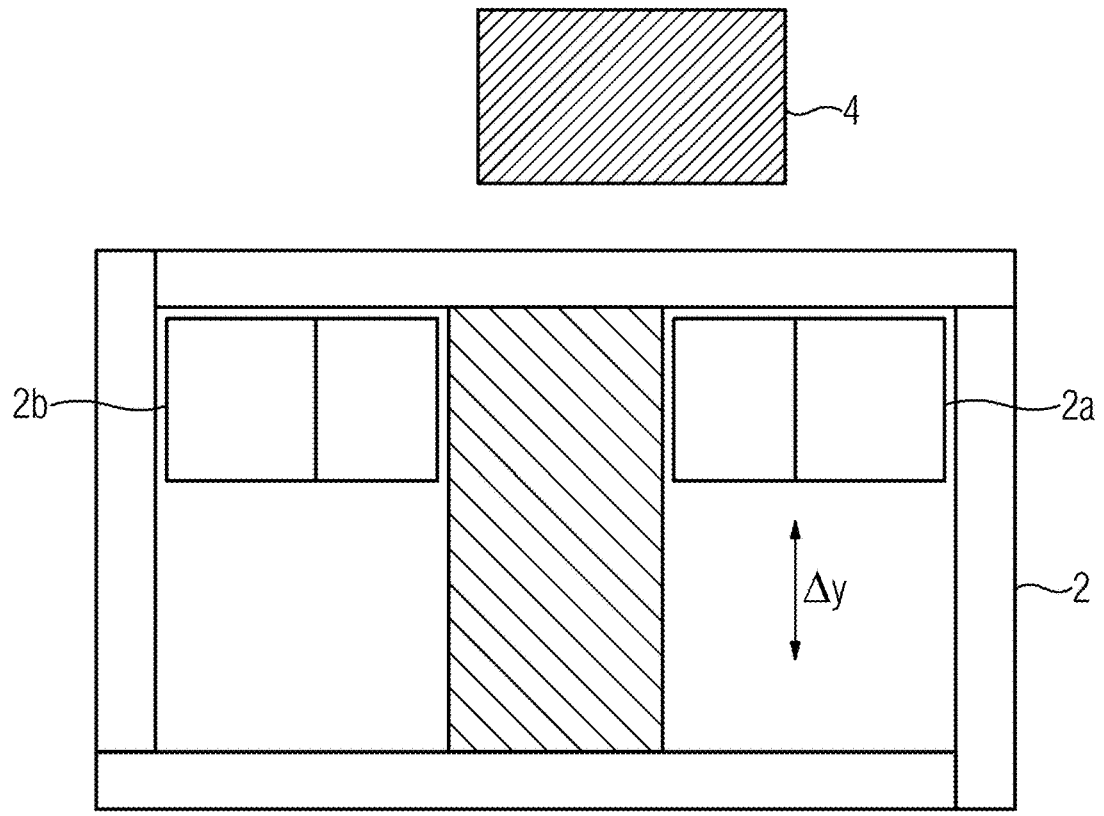
FIG. 2 shows schematically a magnet arrangement according to a further example implementation of a device according to an embodiment of the improved concept.

In FIG. 2, an example implementation of an embodiment of the magnet arrangement 2 is shown schematically. The magnet arrangement 2 can for example be used in the device 1 according to FIG. 1.

In the example of FIG. 2, the magnet arrangement 2 comprises a first magnet component 2a and a second magnet component 2b. The magnet components 2a, 2b may for example be implemented as permanent magnets, electromagnets or superconductors.

The magnet adjustment arrangement 8 may for example change the position in one or more directions, for example in y-direction, of the magnet component 2a with respect to the whole magnet arrangement 2 or the whole device 1 or the housing 10, respectively.

In this way, the position of the magnet field of view and consequently of the joint field of view 6 may be tuned.

Figure 3:
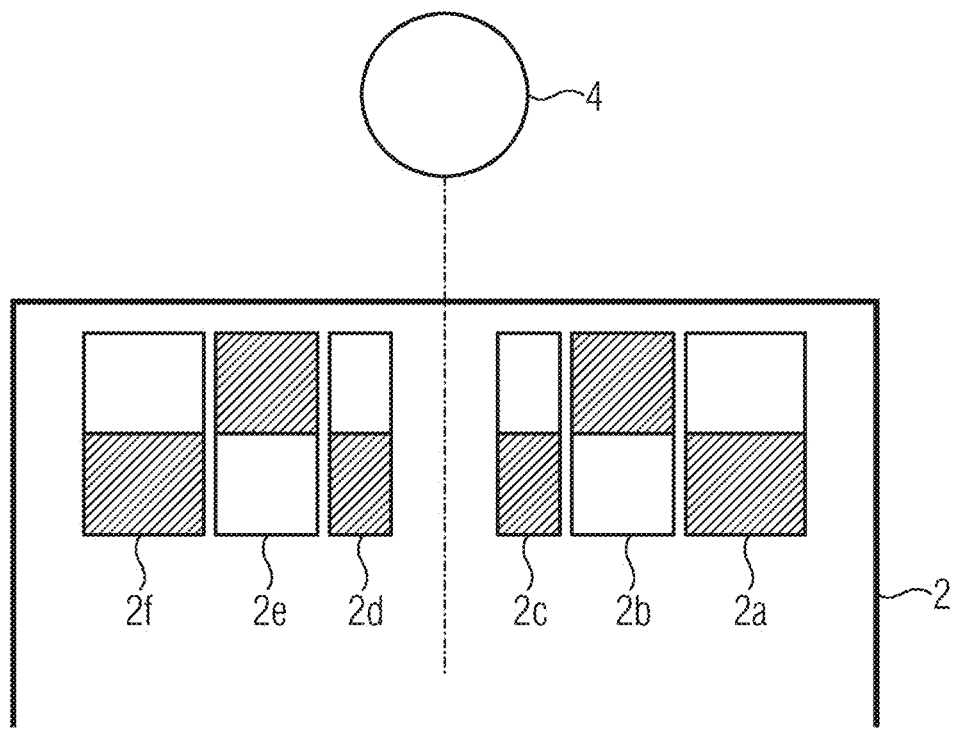
FIG. 3 shows schematically a magnet arrangement according to a further example implementation of a device according to an embodiment of the improved concept.
Figure 4:
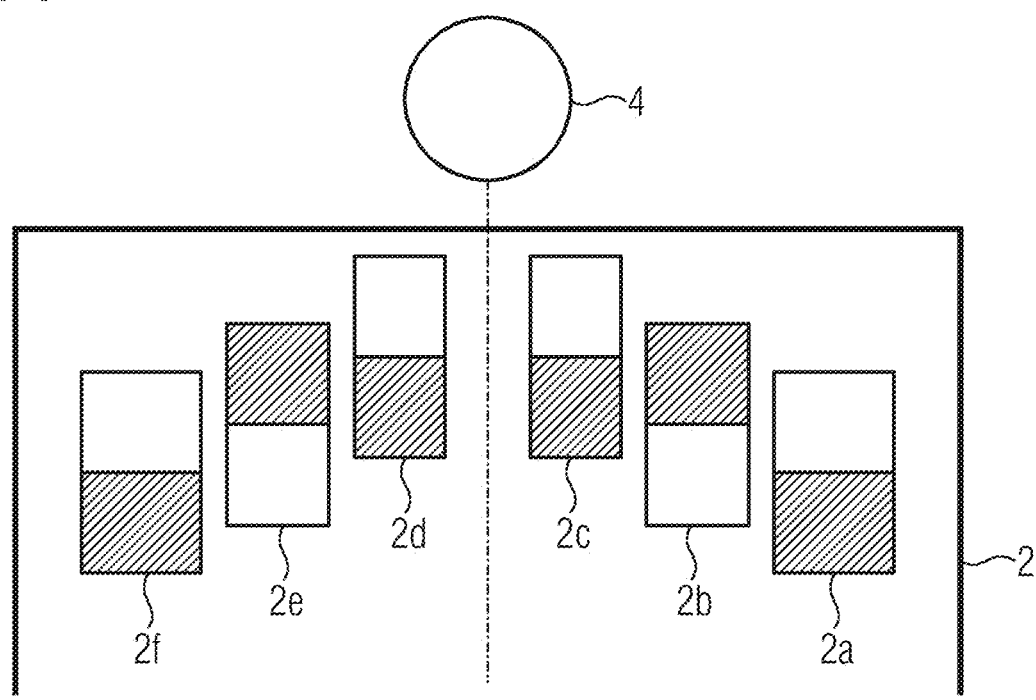
FIG. 4 shows schematically a magnet arrangement according to a further example implementation of a device according to an embodiment of the improved concept.

In FIG. 3 and FIG. 4, a further example implementation of an embodiment of the magnet arrangement 2, which may be used in the device 1 according to FIG. 1, is shown.

Therein, FIG. 3 and FIG. 4 correspond to different states of the same magnet arrangement 2.

The magnet arrangement 2 according to FIG. 3 and FIG. 4 comprises a plurality of magnet components 2a, 2b, 2c, 2d, 2e, 2f, which may be designed as permanent magnets, electromagnets or superconductor based magnets.

The magnet adjustment arrangement 8 is configured to change the individual positions of the individual magnet components 2a to 2f with respect to each other. Alternatively or in addition, in particular in case of electromagnets, the magnet adjustment arrangement 8 may also change the field intensity of the individual magnetic fields of the magnet components 2a to 2f.

In this way, the position of the magnet field of view 4 with respect to the device 1 or the magnet arrangement 2 may be modified.

In particular, the magnet adjustment arrangement 8 may apply techniques known from magnet shimming in the context of MRI apparatuses.

Figure 5:
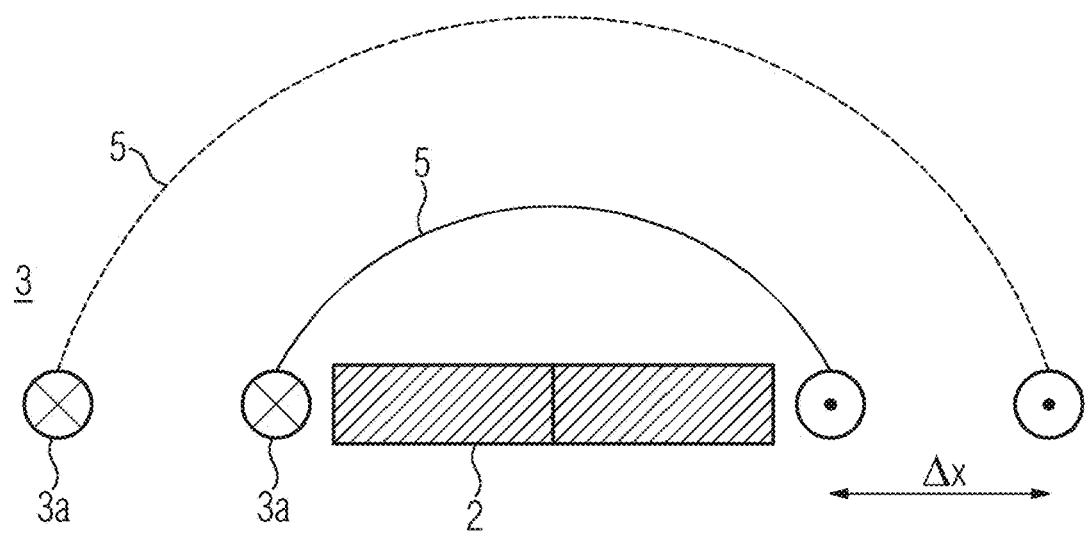
FIG. 5 shows schematically a magnet arrangement and a coil arrangement of a further example implementation of a device according to an embodiment of the improved concept.

In FIG. 5, an example implementation of an embodiment of the magnet arrangement 2 and a coil arrangement 3, which can be used in a device 1 as shown in FIG. 1, is shown.

In particular, the magnet arrangement 2 may be implemented as described with respect to FIG. 2 to FIG. 4.

The coil arrangement 3 comprises a coil 3a and may comprise one ne or more further coils. Therein, FIG. 5 shows two different states of the coil 3a, wherein the diameter of the coil 3a is changed along the x-axis of the coordinate system by the coil adjustment arrangement 9. For example, the coil adjustment arrangement 9 may comprise means to modify the geometry or diameter for example by stretching windings or moving individual windings or parts of windings to modify the position or extent of the coil field of view 5.

Figure 6:
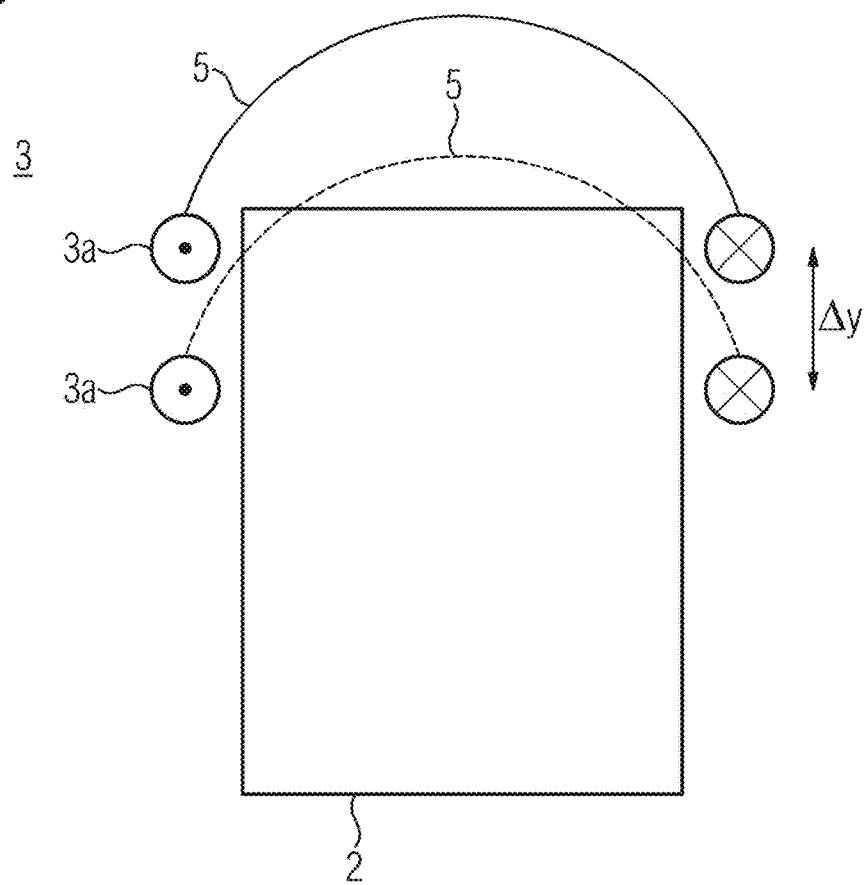
FIG. 6 shows schematically a magnet arrangement and a coil arrangement of a further example implementation of a device according to an embodiment of the improved concept.

In FIG. 6, a further example implementation of an embodiment of the magnet arrangement 2 and the coil arrangement 3 is shown. The magnet arrangement 2 and the coil arrangement 3 of FIG. 6 may also be used in a device 1 as shown with respect to FIG. 1.

According to the example of FIG. 6, the position of the coil 3a may be shifted in y-direction by the coil adjustment arrangement 9. In particular, the coil 3a may be shifted with respect to the magnet arrangement 2.

As explained with respect to FIG. 2 to FIG. 6, the magnet adjustment arrangement 8 and/or the coil adjustment arrangement 9 may be configured to change the respective positions of the magnet field of view 4 and/or the coil field of view 5 to effectively change the position of the joint field of view 6 with respect to the device.

The individual implementations of the magnet arrangement 2, the coil arrangement 3, the magnet adjustment arrangement 8 and/or the coil adjustment arrangement 9 may also be combined.

Figure 7:
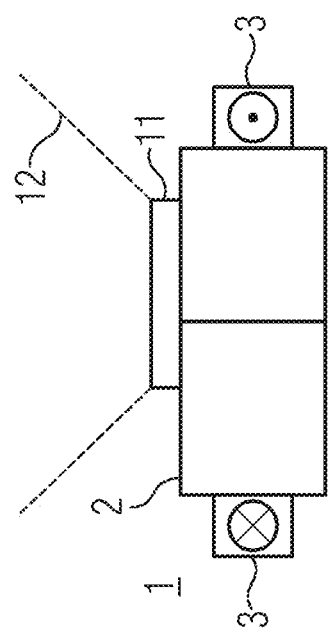
FIG. 7 shows a further example implementation of a device according to an embodiment of the improved concept.

In FIG. 7, a further example implementation of an embodiment of the device 1 is shown. For simplicity, the housing 10, the control unit 7 and the adjustment arrangements 8, 9 are not shown in FIG. 7.

In the implementation of FIG. 7, the device 1 further comprises an ultrasonic sensor system 11, which is mounted to the magnet arrangement 2, in particular is rigidly fixed to the magnet arrangement 2. The ultrasonic sensor system 11 has an ultrasonic field of view 12, which overlaps at least in part with the joint field of view 6.

Since the ultrasonic sensor system 11 is fixed to the magnet arrangement 2, any change in position of the magnet arrangement affects the position of the ultrasonic sensor system 11 in the same way and vice versa. In this way, the joint field of view 6 and the ultrasonic field of view 12 are intrinsically registered to each other.

In alternative implementations (not shown), the ultrasonic sensor system 11 is fixed directly to one or more of the magnet components 2a to 2f.

Figure 8:
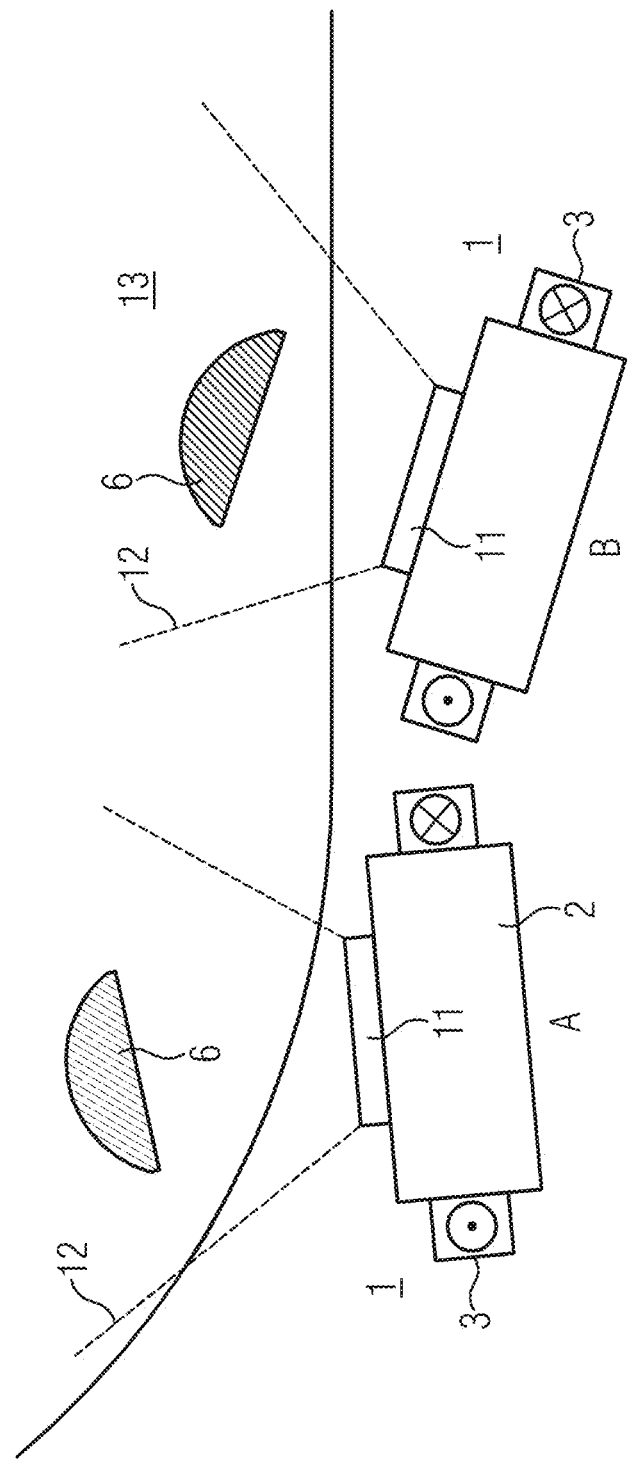
FIG. 8 shows a further example implementation of a device according to an embodiment of the improved concept.

The intrinsic registration is visualized schematically in FIG. 8 showing an object 13 and the device 1 of an embodiment of FIG. 7 in two different situations denotes as A and B, respectively.

As can be seen in FIG. 8, the joint field of view 6 and the ultrasonic field of view 12 are tied to each other, so one follows the other upon movement of the device 1.

In particular, the intrinsic registration is achieved by mounting the ultrasonic sensor system 11 in a fixed geometry with known distance and orientation to the device 1 or the magnet arrangement 2.

The device 1 explained with respect to FIG. 1 to FIG. 8 may for example carry out NMR spectroscopy sequences based on FID sequences or spin-echo FDI sequences.

In case the object 13 is a human or animal body, the device 1 can therefore be used to acquire information regarding T2, T2*, fat content and/or proton density signal chances according to tissue type.

In particular, it is not required to apply magnetic field gradients. The achievable resolution of, for example, 1 cm×1 cm×1 cm for the joint field of view 6 is sufficient for a variety of applications.

FIG. 9 shows a flow diagram of an example implementation of an embodiment of a method for NMR spectroscopy according to the improved concept. In particular a device 1 for NMR spectroscopy according to the improved concept, for example as explained with respect to FIG. 1 to FIG. 8, may be used to carry out the method.

In step S1, the position of the joint field of view 6 is adjusted as described above. In step S2, an NMR measurement is carried out to acquire first NMR data. Then, in step 3 the joint field of view 6 is changed as described above and in step S4, again an NMR measurement is carried out to acquire second NMR data.

In an optional step S5 the control unit 7 may for example compare the first and the second NMR data to each other to acquire information of a spatial region between the two spatial positions of the joint field of view 6 according to the two NMR measurements. In particular, the control unit 7 may interpolate the first and the second NMR data to determine virtual NMR data for the spatial region in between.

In this way, the effective resolution of the approach can be further improved.

FIG. 10 shows a flow diagram of an embodiment of a further example implementation according to the improved concept.

The method according to claim 1 may also be carried out by a device 1 according to the improved concept.

In step S1' of the method, the joint field of view 6 is focussed to a target region as described above. In step S2', an NMR measurement, for example a T2-measurement, without using a contrast agent is carried out.

In step S3' a contrast agent is applied to the object 13. In step S4', the T2-measurement is repeated.

In step S5', the control unit 7 determines whether the characteristics of the T2 time has significantly changed within the joint field of view 6.

If this is the case, it may deduced in step S6a that the part of the object 13 corresponding to the joint field of view 6 has actually received a significant amount of the contrast agent. On the other hand, if the characteristics of the T2 time has not changed significantly, it may be deduced in step S6b that the corresponding portion of the object 13 has not received a significant amount of the contrast agent.

As described, the improved concept allows to provide NMR measurements in a particularly simple way by allowing the joint field of view of the magnet field of view and the coil field of view to be changed in position. Consequently, the requirements for the magnet arrangement may be relaxed. For example, it may be sufficient, if the basic magnetic field for generating the magnetic probe field has a maximum amplitude in the range between 0.1 T and 1.5 T.

As a material for the magnet components of the magnet arrangement, permanent magnets, for example NdFeB permanent magnets could be used. Also persistent bulk superconductors such as MgB2 or ReBCO may be used. The latter may trap higher flux densities than the permanent magnets. Also electromagnets, in particular electromagnetic coils, for example combined with iron cores, could also be used.

In some implementations, an ultrasonic sensor system may be mounted on top of the magnet with an ultrasonic field of view direction intrinsically correlated with the magnet field of view. In this way increased specificity of ultrasonic procedures and ultrasonic guided procedures may be achieved.

A device according to the improved concept may be portable and deployed anywhere and may be particularly easy to use.

Finally, it should again be noted that the devices and methods described above in detail are merely example embodiments which can be modified by a person skilled in the art in a wide variety of ways without departing from the scope of the invention. Furthermore, the use of the indefinite article "a" or "an" does not preclude the possibility that the relevant features can also be present plurally. Similarly, the expression "unit" does not preclude this including a plurality of components which can possibly also be spatially distributed.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A device for nuclear magnetic resonance spectroscopy, the device comprising:
   a magnet arrangement, configured to produce a magnetic probe field within a magnet field of view external to the magnet arrangement;
   a coil arrangement, configured to generate an electromagnetic excitation field within a coil field of view;
   a controller, configured to control the coil arrangement; and
   a magnet adjustment arrangement, configured and arranged to modify at least one parameter of the magnet arrangement to change a spatial position of the magnet field of view.

2. The device of claim 1, wherein at least one of
   the magnet arrangement comprises one or more magnet components, and the magnet adjustment arrangement is configured to modify at least one of a position or an orientation of at least one of the one or more magnet components to change the spatial position of the magnet field of view; or
   the magnet arrangement comprises an electromagnet, and the magnet adjustment arrangement is configured to modify a current through the electromagnet to change the spatial position of the magnet field of view.

3. The device of claim 1, wherein the magnet arrangement comprises at least two magnet components, and the magnet adjustment arrangement is configured to modify at least one of a relative position or a relative orientation of the at least two magnet components with respect to each other to change the spatial position of the magnet field of view.

4. The device of claim 1, further comprising:
   a coil adjustment arrangement, configured and arranged to modify at least one parameter of the coil arrangement to change a spatial position of the coil field of view.

5. The device of claim 4, wherein the coil arrangement comprises one or more coils, and the coil adjustment arrangement is configured to modify at least one of a position, an orientation or a geometric shape of at least one of the one or more coils to change the spatial position of the coil field of view.

6. The device of claim 1, further comprising:
   an ultrasonic sensor system with an ultrasonic field of view, the ultrasonic sensor system being mechanically coupled to the magnet arrangement to ensure a fixed spatial relation between the ultrasonic field of view and the magnet field of view.

7. The device of claim 1, further comprising:
   an ultrasonic sensor system with an ultrasonic field of view; and
   a monitoring system, configured to determine a spatial relation between the ultrasonic sensor system and the magnet arrangement.

8. The device of claim 7, further comprising:
   an ultrasonic adjustment arrangement, configured and arranged to adjust the spatial relation between the ultrasonic sensor system and the magnet arrangement to ensure a fixed spatial relation between the ultrasonic field of view and the magnet field of view.

9. The device of claim 6, wherein the controller is configured to control the ultrasonic sensor system and the coil arrangement to carry out an ultrasonic assisted magnetic resonance spectroscopy.

10. The device of claim 2, wherein the magnet arrangement comprises at least two magnet components, and the magnet adjustment arrangement is configured to modify at least one of a relative position or a relative orientation of the at least two magnet components with respect to each other to change the spatial position of the magnet field of view.

11. The device of claim 2, further comprising:
    a coil adjustment arrangement, configured and arranged to modify at least one parameter of the coil arrangement to change a spatial position of the coil field of view.

12. The device of claim 11, wherein the coil arrangement comprises one or more coils, and the coil adjustment arrangement is configured to modify at least one of a position, an orientation or a geometric shape of at least one of the one or more coils to change the spatial position of the coil field of view.

13. The device of claim 2, further comprising:
    an ultrasonic sensor system with an ultrasonic field of view, the ultrasonic sensor system being mechanically coupled to the magnet arrangement to ensure a fixed spatial relation between the ultrasonic field of view and the magnet field of view.

14. The device of claim 2, further comprising:
    an ultrasonic sensor system with an ultrasonic field of view; and
    a monitoring system, configured to determine a spatial relation between the ultrasonic sensor system and the magnet arrangement.

15. A method for nuclear magnetic resonance spectroscopy, the method comprising:
adjusting at least one of
a magnet field of view of a magnet arrangement of a device for nuclear magnetic resonance spectroscopy, the magnet field of view being external to the magnet arrangement, or
a coil field of view of a coil arrangement of the device, wherein
the adjusting achieves a first joint field of view given by an overlapping volume of the magnet field of view and the coil field of view; and
acquiring first magnetic resonance data regarding an object, according to the first joint field of view.

16. The method of claim 15, further comprising:
changing at least one of the magnet field of view or the coil field of view to achieve a second joint field of view given by the overlapping volume of the magnet field of view and the coil field of view; and
acquiring second magnetic resonance data regarding the object according to the second joint field of view.

17. The method of claim 16, further comprising:
interpolating the first magnetic resonance data and the second magnetic resonance data to determine virtual magnetic resonance data for a spatial region between the first joint field of view and the second joint field of view.

18. The method of claim 16, further comprising:
applying, after the acquiring of the first magnetic resonance data, a contrast agent to the object;
acquiring, after the applying of the contrast agent, third magnetic resonance data regarding the object, according to the first joint field of view; and
determining, based on a comparison of the first magnetic resonance data to the third magnetic resonance data, to what extent a part of the object within the first joint field of view has received the contrast agent.

19. The method of claim 17, further comprising:
applying, after the acquiring of the first magnetic resonance data, a contrast agent to the object;
acquiring, after the applying of the contrast agent, third magnetic resonance data regarding the object, according to the first joint field of view; and
determining, based on a comparison of the first magnetic resonance data to the third magnetic resonance data, to what extent a part of the object within the first joint field of view has received the contrast agent.

20. The method of claim 15, further comprising:
applying, after the acquiring of the first magnetic resonance data, a contrast agent to the object;
acquiring, after the applying of the contrast agent, second magnetic resonance data regarding the object, according to the first joint field of view; and
determining, based on a comparison of the first magnetic resonance data to the second magnetic resonance data, to what extent a part of the object within the first joint field of view has received the contrast agent.

21. The method of claim 15, wherein the acquiring of the first magnetic resonance data includes controlling the coil arrangement according to a free induction decay, FID, sequence or according to a spin-echo FID sequence.

22. The method of claim 15, wherein an ultrasonic assisted magnetic resonance spectroscopy is carried out by controlling the coil arrangement and an ultrasonic sensor system of the device, the ultrasonic sensor system being mechanically coupled to the magnet arrangement, to ensure a fixed spatial relation between an ultrasonic field of view of the ultrasonic sensor system and the magnet field of view.

* * * * *